(12) United States Patent
Volant et al.

(10) Patent No.: US 8,242,604 B2
(45) Date of Patent: Aug. 14, 2012

(54) COAXIAL THROUGH-SILICON VIA

(75) Inventors: Richard P. Volant, New Fairfield, CT (US); Mukta G. Farooq, Hopewell Jct., NY (US); Paul F. Findeis, Verbank, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 12/607,098

(22) Filed: Oct. 28, 2009

(65) Prior Publication Data

US 2011/0095435 A1   Apr. 28, 2011

(51) Int. Cl.
*H01L 23/48* (2006.01)
*H01L 23/52* (2006.01)
*H01L 29/40* (2006.01)

(52) U.S. Cl. ......................... 257/774; 257/773

(58) Field of Classification Search .................. 257/622, 257/686, 777, 774, 773
See application file for complete search history.

(56) References Cited

U.S. PATENT DOCUMENTS

| | | | |
|---|---|---|---|
| 6,410,431 B2 | 6/2002 | Bertin et al. | |
| 7,564,115 B2 | 7/2009 | Chen et al. | |
| 2005/0121768 A1 | 6/2005 | Edelstein et al. | |
| 2009/0032951 A1 | 2/2009 | Andry et al. | |
| 2010/0133696 A1* | 6/2010 | Chen et al. | 257/774 |
| 2010/0148370 A1* | 6/2010 | Han | 257/774 |
| 2010/0264512 A1* | 10/2010 | Lin et al. | 257/528 |
| 2010/0308435 A1* | 12/2010 | Nowak et al. | 257/532 |
| 2010/0308443 A1* | 12/2010 | Suthiwongsunthorn et al. | 257/621 |
| 2011/0031632 A1* | 2/2011 | Pratt | 257/774 |
| 2011/0034021 A1* | 2/2011 | Feng et al. | 438/600 |
| 2011/0045636 A1* | 2/2011 | Chung | 438/109 |
| 2011/0108986 A1* | 5/2011 | Lin et al. | 257/751 |
| 2011/0108988 A1* | 5/2011 | Lim et al. | 257/751 |
| 2011/0121462 A1* | 5/2011 | Kim | 257/774 |
| 2011/0121811 A1* | 5/2011 | Dennard et al. | 323/318 |

OTHER PUBLICATIONS

International Search Report/Written Opiinion, May 27, 2011.

\* cited by examiner

*Primary Examiner* — S. V. Clark
(74) *Attorney, Agent, or Firm* — H. Daniel Schnurmann

(57) ABSTRACT

A through-silicon via (TSV) structure forming a unique coaxial or triaxial interconnect within the silicon substrate. The TSV structure is provided with two or more independent electrical conductors insulated from another and from the substrate. The electrical conductors can be connected to different voltages or ground, making it possible to operate the TSV structure as a coaxial or triaxial device. Multiple layers using various insulator materials can be used as insulator, wherein the layers are selected based on dielectric properties, fill properties, interfacial adhesion, CTE match, and the like. The TSV structure overcomes defects in the outer insulation layer that may lead to leakage. A method of fabricating such a TSV structure is also described.

13 Claims, 7 Drawing Sheets

TRIAXIAL

ETCH VIA

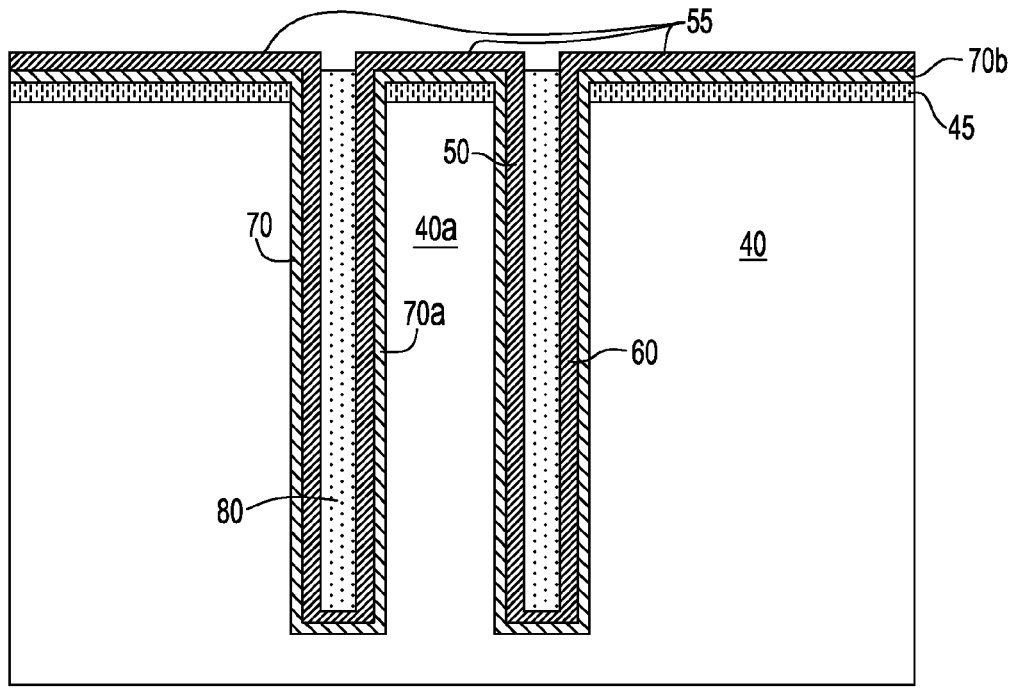
LINEAR/SEED DEP AND CONFORMAL CU PLATE    FIG. 6
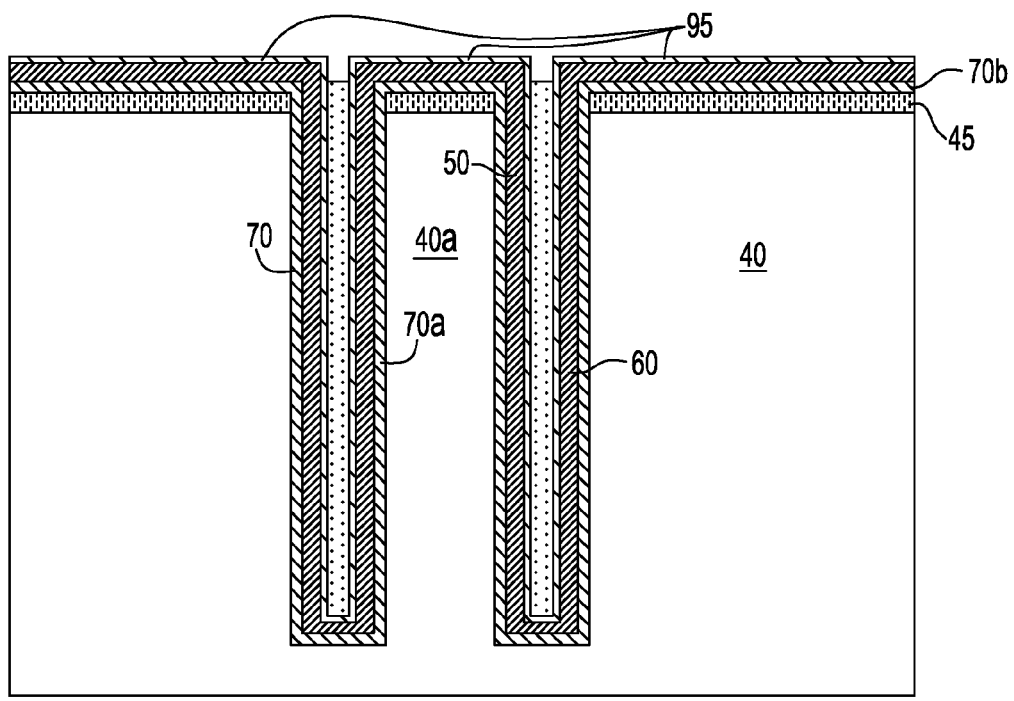
REVERSE LINER, OR BARRIER DEP    FIG. 7

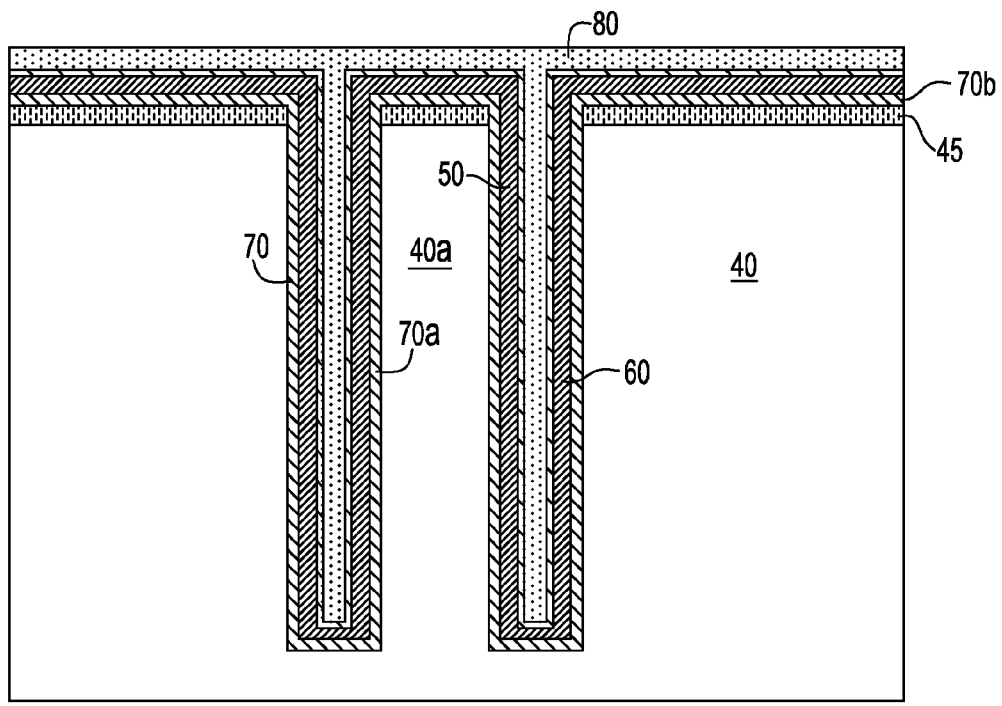
PSPI FILL  FIG. 8
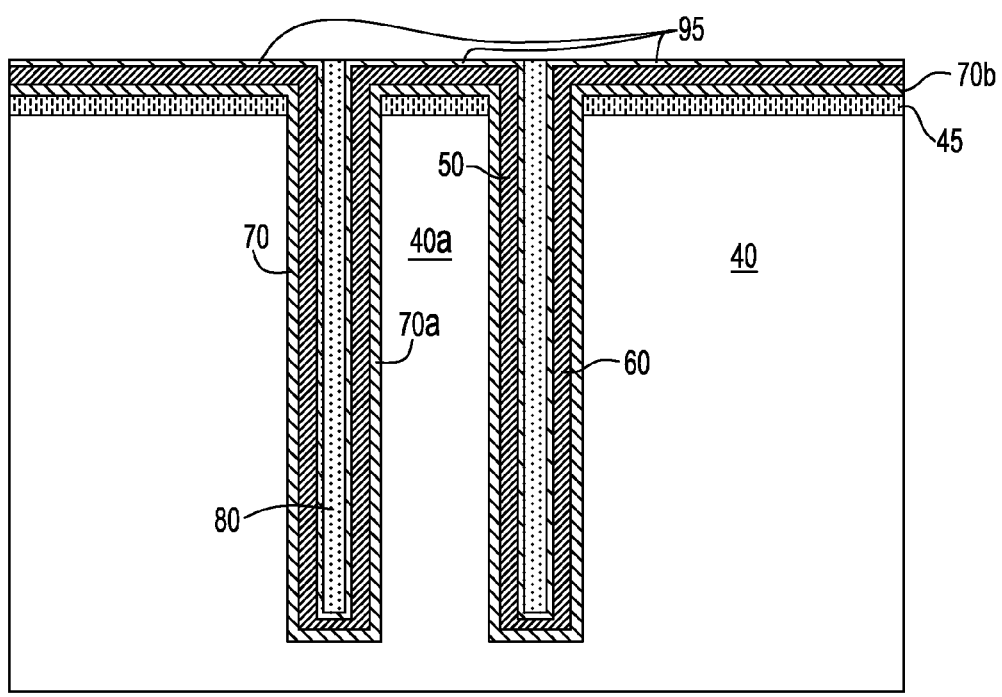
PSPI ETCH BACK  FIG. 9

BARRIER/LINER REMOVAL,
CU CMP, LINER CMP

BACKSIDE THINNING AND ETCH
TO EXPOSE BOTTOM OF VIAS

BACKSIDE DIELECTRIC
DEPOSITION

BACKSIDE CMP

TRIAXIAL

COAXIAL THROUGH-SILICON VIA

TECHNICAL FIELD

The present invention relates generally to a semiconductor structure and method of fabricating the same, and more particularly, to a structure and method of forming an interconnect coaxial and triaxial through-silicon via (TSV) device.

BACKGROUND

Typical electronic systems may comprise a variety of electronic components fabricated specifically for a particular function. Sometimes it is impossible for these various components to be fabricated on the same substrate due to material or processing differences or performance issues. It is therefore usually necessary to package the separate components and then connect them externally to function together as a system.

Usually components are connected using wire bonding or C4 flip chip packages. With microelectronics constantly scaling downward in size, the limits of direct scaling may soon be reached. Along with scaling of devices, there is an additional issue related to scaling the interconnects in order to accommodate such devices and their increasing densities.

Device speeds and therefore product performance is becoming limited by the interconnects between the various circuits involved in an overall product. For example, a CPU interfacing with memory or I/O circuits may become performance limited by the length and performance of the wires connecting them. The same issues also drive increased power requirements as well as heat dissipation limitations.

Traditional coaxial connections are described, e.g., in U.S. Pat. No. 6,410,431 to Bertin et al, in which an outer and annular cylinder and inner cylinder are filled with electrically conducting material, and the middle annular cylinder is filled with an electrically insulating material. The method of forming this structure involves sequential processing steps for each discrete portion of the coaxial structure.

FIG. 1 is a top-down view of prior art through-chip conductors 40C and 40D for low inductance chip-to-chip integration cited previously. Referring to conductor 40C, two concentric features 40A and 152 are formed separately using the following processes: lithography, etching, deposition, surface polish or planarization. Bertin's structure, as described in the aforementioned patent, is provided with an outer conductor that is electrically connected to the Si substrate in which it resides at the same potential as the aforementioned Si substrate. In the second embodiment, shown in conductor 40D, two individual features referenced as 40A are illustrated surrounded by feature 152.

In a conventional TSV, isolation from the signal to the substrate and/or adjacent structures is generally determined by the thickness and properties of the sidewall passivation. In the prior art, it is normally a thin oxide, preferably 1 µm or less. When it is manufactured by sub-atmospheric chemical vapor deposition (SACVD), also referred to as a high aspect ratio process (HARP), which in this case refers to an oxide deposition process typically CVD, it enables a non-thermal oxide to be deposited in a trench or via. However, the film quality may be rather poor. With a dielectric constant of about 5 to 7, as compared to approximately 4 for a good tetraethylorthosilicate (TEOS) film, SACVD is considered a good choice in view of it being conformal at low temperature (430° C.). In addition, a furnace oxidation cannot be used after the devices are built due to its high temperature, above 1000° C.

It is known that coaxial conductors work best in the aforementioned situations. An advantage of a coaxial structure over other types of transmission lines is that in an ideal coaxial conductor, the electromagnetic field carrying the signal exists only in the space between the inner and outer conductors. This allows coaxial conductor to be installed next to conductive materials without the power losses that occur in other transmission lines, and provides protection of the signal from external electromagnetic interference.

Accordingly, there is a need for a solution in the form of a coaxial TSV fabricated such that the center conductor provided with an outer shield, all of which are constructed using conventional CMOS processes.

SUMMARY

In accordance with a first aspect of the present invention, a structure and a method of manufacturing a TSV coaxial or triaxial via in a silicon substrate are described.

In another aspect of the invention, the structure has two or more independent electrical conductors which are insulated with respect to each other and to the silicon substrate. The two electrical conductors are set at different potentials, and at a different potential than the silicon substrate, making it possible to operate the inventive structure as a TSV coaxial. The two independent conductors are formed concurrently, as will be described hereinafter. Multiple layers using various insulator materials can be used as insulators. The layers can be selected based on the dielectric properties, fill properties, interfacial adhesion, CTE match, and the like. The structure thus described overcomes any defects in the outer insulation layer that may lead to leakage.

In still another aspect of the invention, three independent conductors insulated from one another and the substrate can be implemented to form a triaxial TSV structure.

In yet another aspect of the invention, an integrated circuit (IC) through-silicon via (TSV) structure is provided that includes:

a substrate having at least one of the TSVs, and parallel insulated conductive lines spanning the length of the TSV, the TSV substantially extending from a top surface of the substrate to a bottom surface thereof, the conductive lines making electrical contact with interconnect wires.

In yet another aspect of the invention, a method of forming an IC TSV on a substrate is provided that includes:

etching at least one annular via within the substrate leaving exposed a central post;

conformally forming a dielectric film covering a) an outer circumference on an outer circumference of the TSV sidewalls, b) an inner circumference covering the sidewall of the central post, and c) a dielectric film deposited substantially upon a top surface of an underlying active layer;

conformally depositing a liner and a seed for copper plating and a conformal plated copper layer, forming an inner or signal conductor and an outer conductor or shield;

conformally depositing a barrier layer covering the copper inner conductor and the outer conductor;

filling any remaining via space with polyimide and curing it; and planarizing the top surface and the bottom surface until the copper conductors are separated from one another.

The conductive lines can be connected to active layers provided with interconnect wires or passive circuitry formed on the substrate, attaching the coaxial or triaxial structures thus formed to interconnect wiring set at different voltages. The structure thus formed provides a solution in the form of a coaxial TSV fabricated such that the center conductor and outer shield are formed concurrently, providing a significant capacitance reduction. Any insulator may be used to fill the central region, as long as it has acceptable levels of breakdown voltage (Vbd), and leakage current (J) at operating conditions.

The multiple layers can be used as insulators, e.g., material A, followed by material B, and the like, wherein the layers are selected based on their dielectric properties, fill properties, interfacial adhesion, CTE match, and the like. The insulator (e.g., PSPI) may be filled from either side of the wafer, the backside filling preferably done after a backside thinning process.

The present invention overcomes any defects in the outer insulation layer which may lead to leakage.

BRIEF DESCRIPTION OF THE DRAWINGS

The present invention will be understood and appreciated more fully from the following detailed description of the invention, taken in conjunction with the accompanying drawings of which:

FIG. 6 illustrates a liner and seed deposition topped by a conformal copper plate, in according to an embodiment of the invention;

FIG. 7 illustrates the next fabrication step showing the annular coaxial TSV having a reverse liner or barrier deposition set to protect the plated copper;

FIGS. 8 and 9 depict the step of filling the trench with PSPI followed by an etch back of the PSPI on the upper surface.

DETAILED DESCRIPTION

Figure 1:
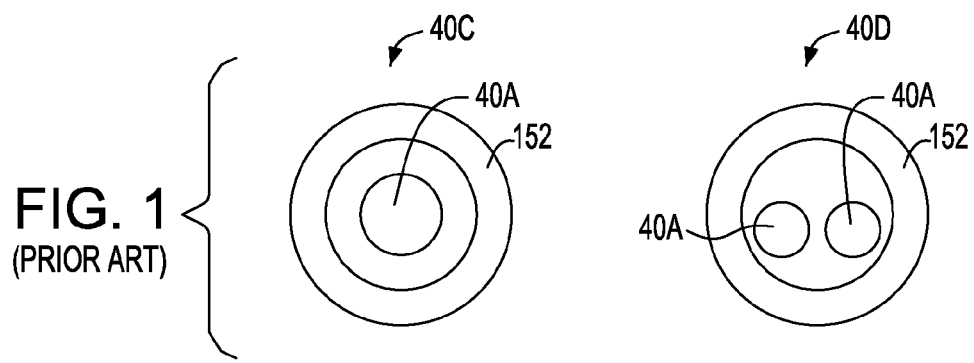
FIG. 1 is a top-down view of prior art etched annular vias.

The accompanying drawings, which are incorporated in and which constitute part of the specification, illustrate the presently preferred embodiments of the invention which, together with the general description given above and the detailed description of the preferred embodiments given below serve to explain the principles of the invention.

It will be appreciated that for simplicity and clarity of illustration, elements shown in the drawings have not necessarily been drawn to scale. For example, dimensions of some of the elements may be exaggerated relative to other elements for clarity.

Figure 2:
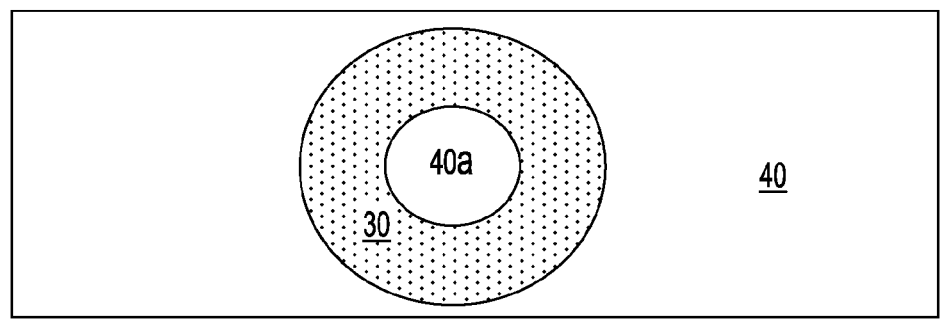
FIGS. 2 and 3 illustrate respectively a top down view and a perspective view of an annular via etched into a substrate.

FIG. 2 depicts a top-down view of an annular via 30 etched into silicon substrate 40. The active built layers 45 are not shown in the plan view for clarity. The structure is provided with a center post 40a made of the same substrate material as defined by the etch. The width of the central post is of the order of 6 μm.

Figure 3:
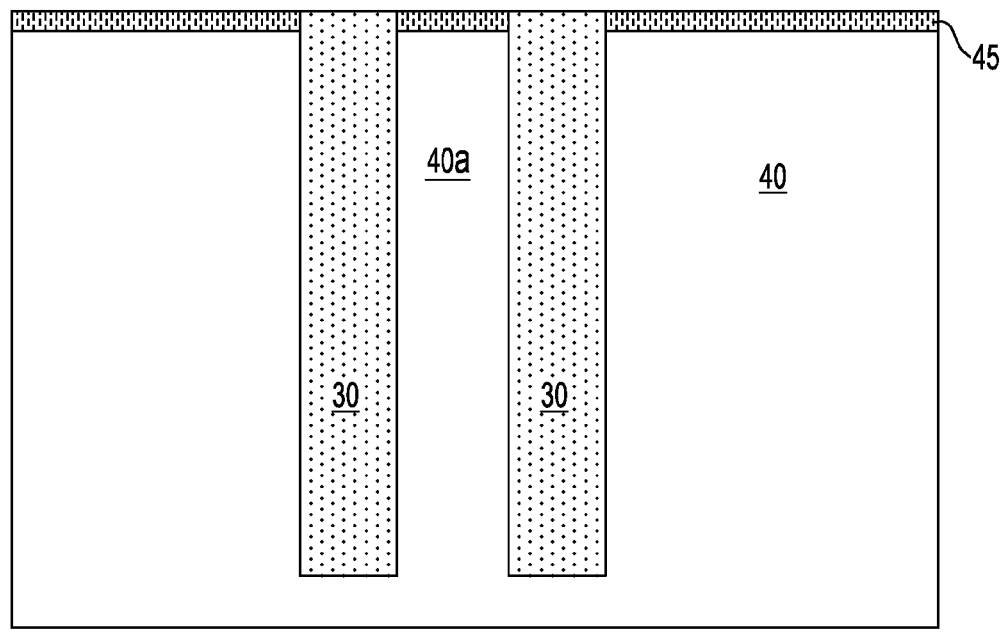

FIG. 3 is a cross-sectional view of FIG. 2 showing an active layer 45. In a preferred embodiment, the substrate 40 and the center post 40a are preferably made of silicon employing conventional lithography applicable to Damascene structures. Layer(s) 45 represent(s) active layers that include, among others, wiring levels of any semiconductor IC or passive circuitry constructed on the substrate 40. At the present juncture, the active layer shorts the top surface of the annular via 30.

Figure 4:
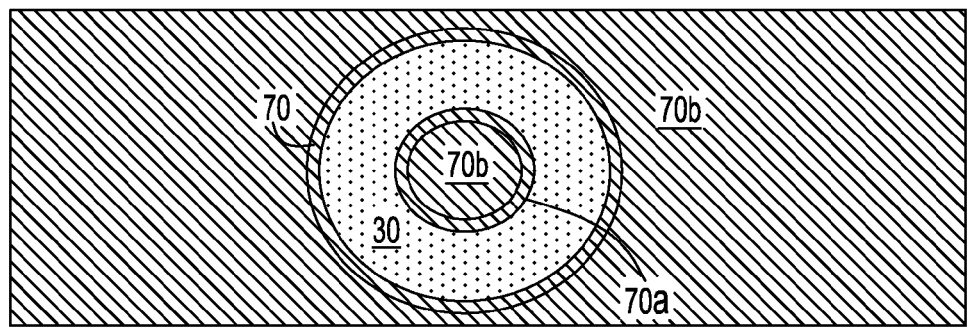
FIGS. 4 and 5 respectively show a top down and a cross-sectional view of the annular via after deposition of a (HARP) dielectric layer.
Figure 5:
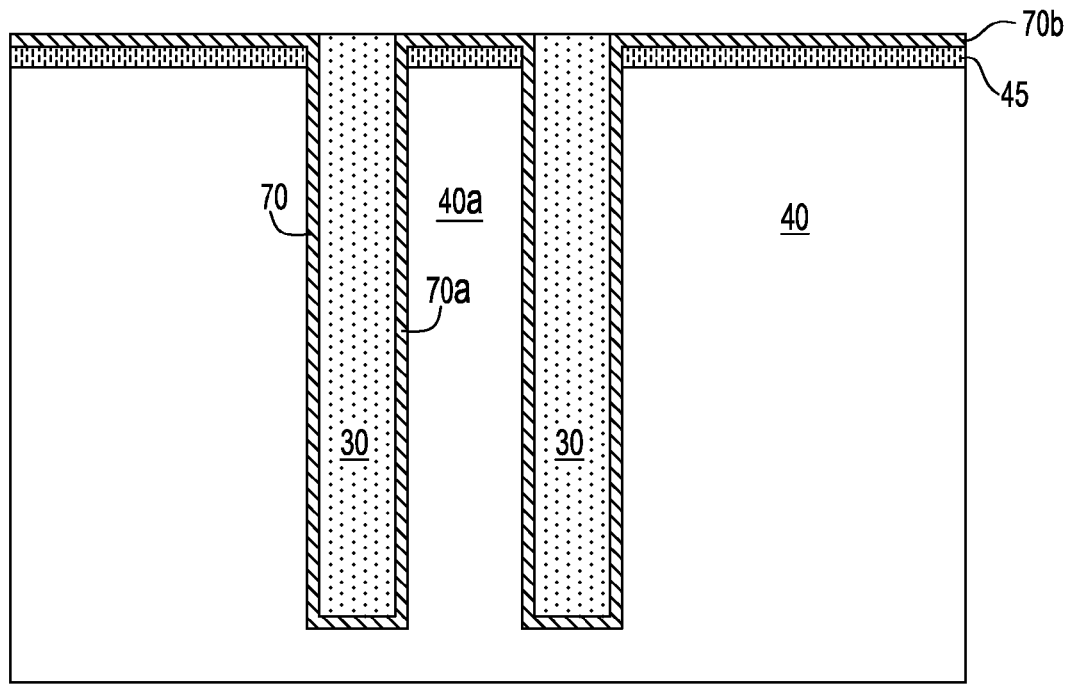

FIGS. 4 and 5 are respectively top-down and cross-sectional views of the annular via 30 after depositing on all exposed surfaces electrically insulating material, such as TEOS (tetraethyl orthosilicate) or Harp (High Aspect Ratio Process) insulator outer wall 70, insulator inner wall 70a, and insulator top surface 70b. The purpose of this layer is to electrically isolate the substrate from any conductive material, and is used to fill the via and to reduce the migration of conductive material into the substrate.

The insulator outer wall 70 is preferably formed by a dielectric film covering the sidewalls of the via 30 outer circumference. The insulator inner wall 70a is preferably made of a dielectric film covering the central post 40a of the via. The insulator inner wall 70b is a dielectric film that is deposited substantially upon the top surface of the underlying active build layer(s) 45. Any insulator may be used to fill the central region, as long as it has acceptable levels of breakdown voltage (Vbd), and leakage current (J) at operating conditions. A preferred insulator such as PSPI (photosensitive polyimide) may be filled from either side of the wafer. However, the backside filling is preferably performed once the backside thinning has been completed.

Referring to FIG. 6, there is shown a liner and seed conformal deposition required for Cu plating and a conformal plated Cu layer, preferably to a demonstrated thickness of 2 μm. The conductor 50 represents what is to become the inner or signal conductor. Similarly, element 60 become the outer conductor or shield. Element 55 represents a conductive layer, preferably made of copper, and is referred as the Cu overburden which subsequently is removed in a later process step. It is worth noting that thus far the inner and outer walls still remain connected to one another.

FIG. 7 shows the next step in the process where protective or barrier layer 95 is deposited, and is preferably made of Ta/TaN or TaN which is deposited conformally covering the copper inner signal conductor 50, the Cu overburden 55 (FIG. 6), and outer conductor 60, that is intended to protect the Cu from future process operations.

FIG. 8 depicts the process steps of filling the remaining via space with polyimide or any other non-conductive filler, followed by curing it. This step will be referred henceforth as PSPI fill.

FIG. 9 illustrates the now totally filled via following the removal of any excess polyimide from the top surface, while leaving the polyimide within the via. This can be accomplished with oxygen plasma, commonly known as an ash process.

Figure 10:
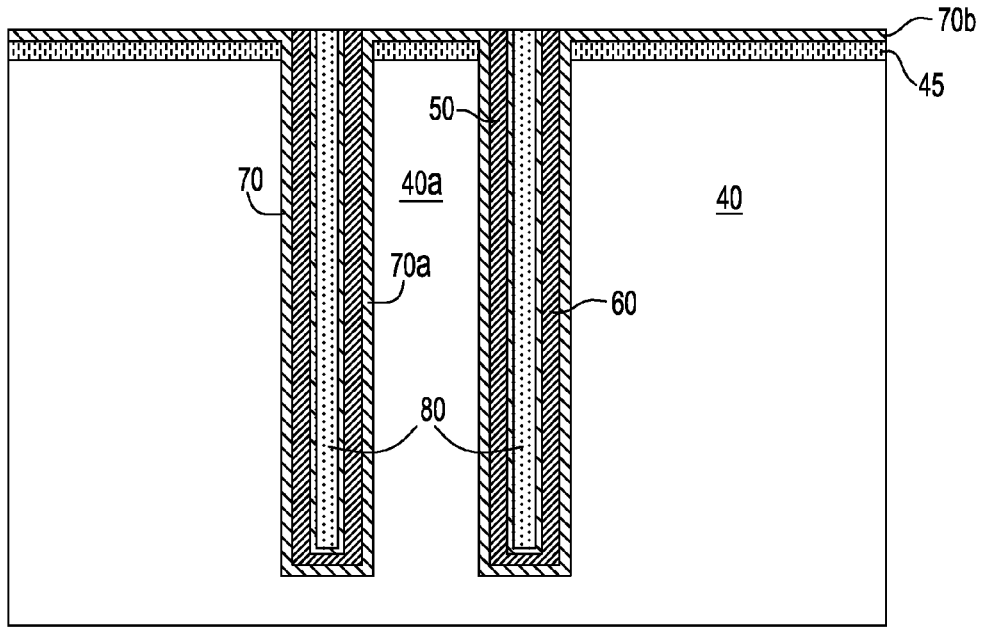
FIG. 10 illustrates removing the barrier/liner, copper and liner using a chemical-mechanical planarization (CMP)

FIG. 10 shows the structure after performing a chemical-mechanical polish (CMP) operation to the top surface of the structure to remove the Cu overburden 55 including the upper portion of the barrier/liner material 95, while making the entire structure(s) substantially planar. While the top surfaces of the TSVs are now separated from each other, the TSVs still remain connected to one another at the respective bottoms of the TSVs.

Figure 11:
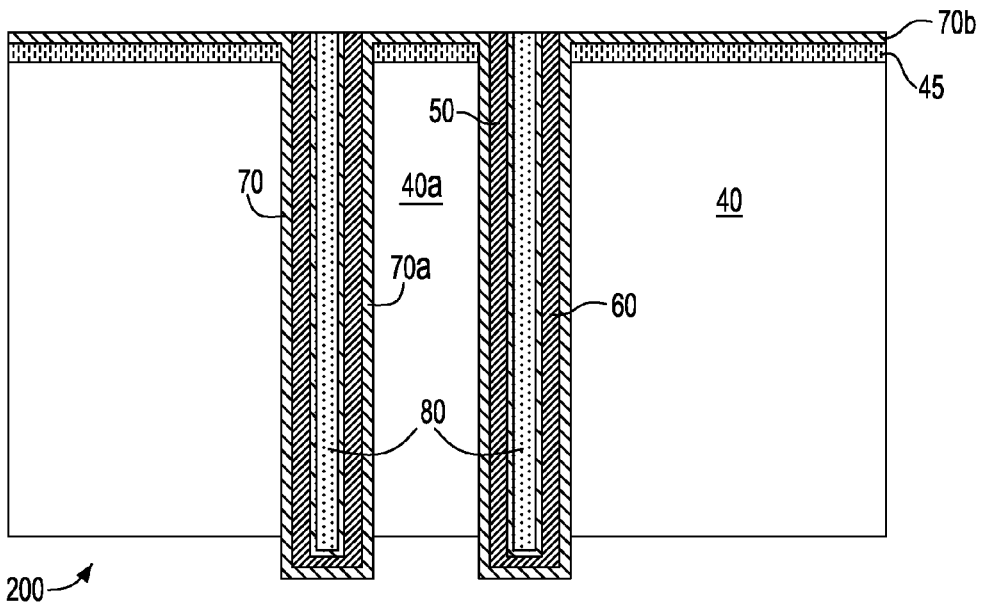
FIG. 11 is a side view of the coaxial TSV showing a backside thinning and etch to expose the bottom of the vias.

FIG. 11 depicts the first process performed on the backside 200 of the substrate, opposite from the active side. This process can be achieved by first filing the substrate (or wafer). In an embodiment of the invention, the backside 200 of the substrate is substantially thinned out using a combination of mechanical grinding, chemical and dry etching in order to expose the bottom portion of the vias which include the center post 40a, inner dielectric 70a, inner conductor 50, the middle dielectric fill 80, outer conductor 60 and the outer wall insulator 70. Note that at this point, the inner and outer conductors remain interconnected.

Figure 12:
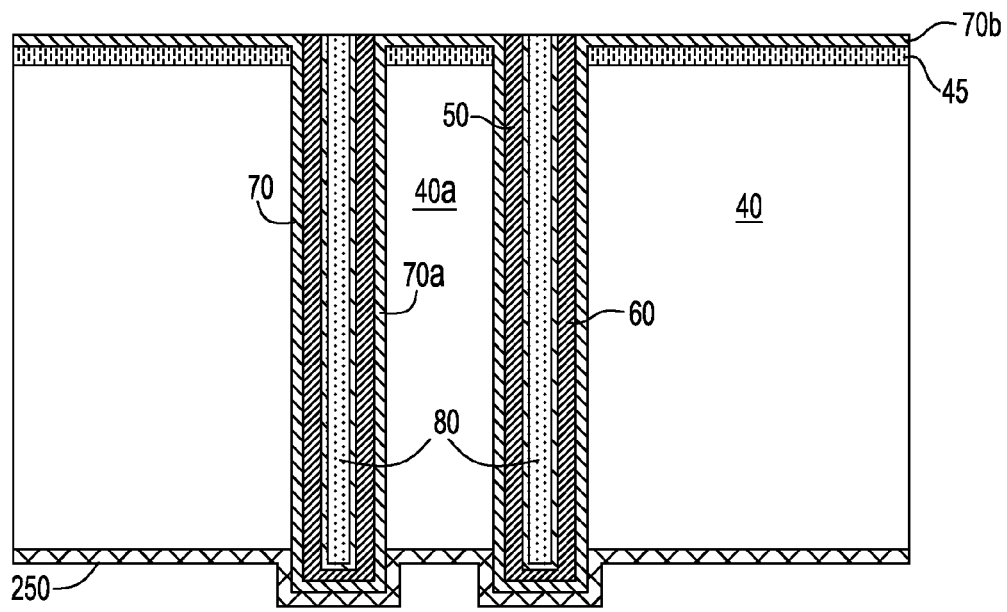
FIG. 12 shows the coaxial structure after dielectric backside deposition and patterning.

FIG. 12 illustrates the addition of a conformal dielectric layer 250 deposition on the backside of the substrate. A dielectric diffusion barrier is preferably used to avoid copper contamination of the silicon.

Figure 13:
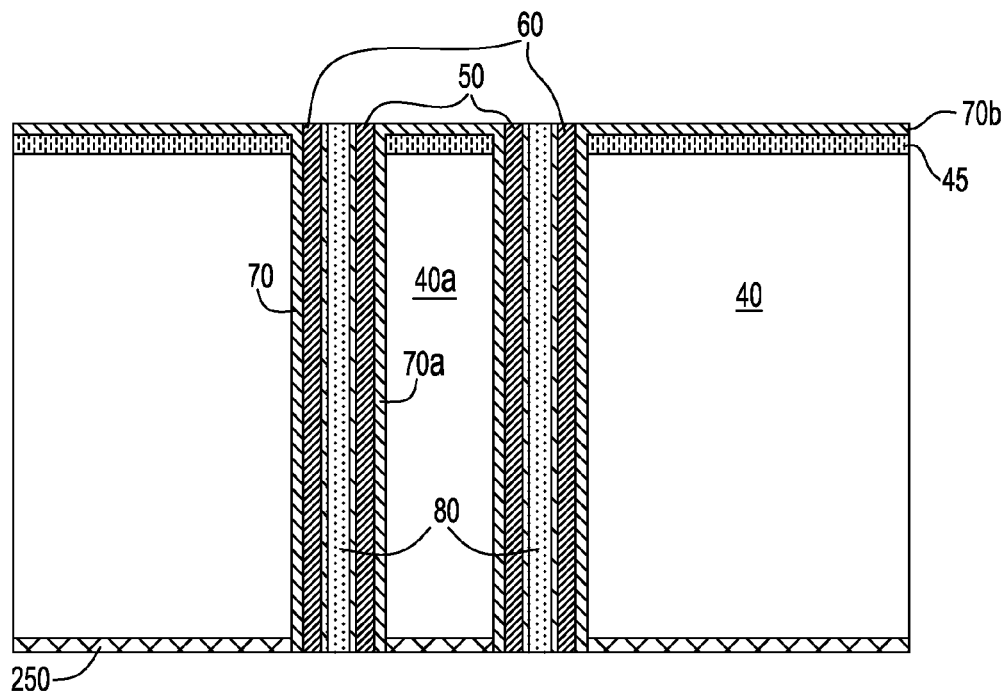
FIG. 13 illustrates the final coaxial structure after backside CMP, according to the present invention.

FIG. 13 depicts the structure following the CMP performed on the backside of the substrate 40 intended to remove any protruding portions of the vias, leaving the dielectric 250 and the via structures substantially planar. It further also removes the bottom portion of the conductive materials in the vias such that the inner conductor 50 is now electrically isolated from the outer conductor 60.

The step of filling the trench with PSPI followed by planarization can be formed by exposing using the same annular mask and develop, The initial photolithography can advantageously use a positive resist. The expose and develop steps that follow form the TSV image in the photoresist. PSPI is typically a negative resist (and must be in this case). Since the same mask is used with opposite tone resists, the features will be negative with respect to one another. Therefore, by using the same mask with PSPI, a pillar of PSPI will be formed over the TSVs, and followed by RIE to remove the very top of the PSPI, while leaving PSPI inside the trench. In an alternate approach, once the Cu has been protected, one can etch the non-photo sensitive polyimide, i.e., a polyimide which is patterned with the use of a resist (i.e., because it is not light sensitive surface), and is followed by CMP planarization.

With the backside thinning completed, a dielectric layer is deposited (FIG. 12, 250) and polished (FIG. 13), thereby completing the formation of a coaxial TSV.

The final structure of the coaxial TSV ends with its two ends independent of one another, operating with a voltage and ground respectively attached to the inner and outer ends of the coaxial. The construction of the coaxial has describes ensures that the inner and outer conductive walls of the coaxial avoid generating any cross-talk noise.

Figure 14:
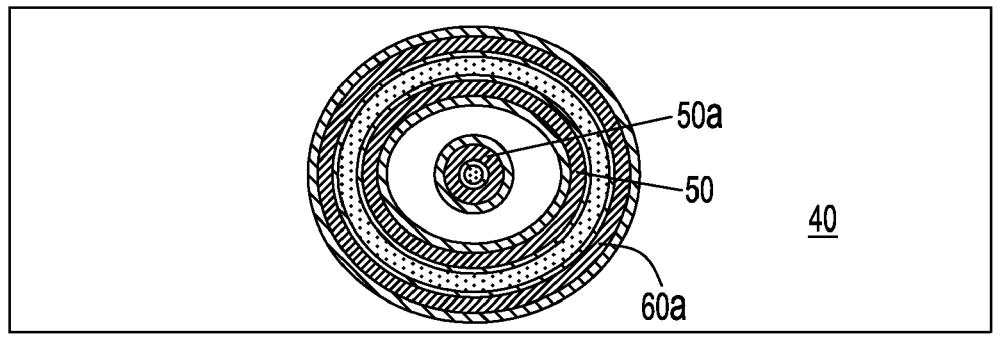
FIGS. 14 and 15 respectively show a top-down and a perspective view of a triaxial structure, according to another embodiment of the present invention.
Figure 15:
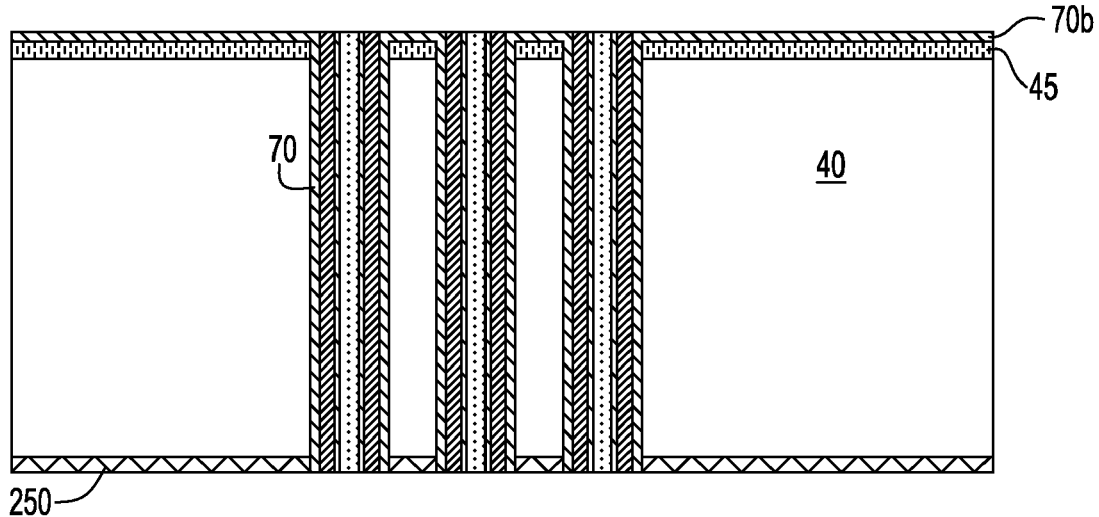

FIGS. 14 and 15 respectively illustrate a planar and a cross-section view of another embodiment of the invention, namely, a triaxial via which is formed using the same process flow as was previously described for the coaxial via. The structure is converted into a unique triaxial via by etching a hole within what was the center post (FIG. 5, 40a) at the same time the annular is etched. This results in a three conductor via with 50a as the inner or signal conductor, 52 as the middle or inner shield conductor and 60a as the outer shield conductor, all of which are electrically independent of each other.

As previously illustrated, the process flow is exactly the same as for the aforementioned coaxial structure. The main difference resides in a pattern being etched at the beginning of the process. Patterning the structure at the first lithography step with a third recess enables forming a third conductor in the substrate. It is worth noting that additive concentric rings may be added to a fourth and a fifth conductor. The number of additional conductor rings added is limited by available space on the substrate.

The structure thus defined can be manufactured using techniques and materials that are compatible with CMOS technology.

In one embodiment of the invention, a desired resist pattern is first created using lithography, It is followed by etching, e.g., reactive ion etch (RIE) to remove the silicon from unprotected areas, forming the outermost wall of the coaxial structures, and defining the inner wall of the annulus.

For illustrative purposes, the outer diameter could range from 10 to 50 μm, while the inner would be 5 to 25 μm. This is followed by a conformal insulator deposition in the range of 0.20 to 2.00 μm thickness. In the next step, a barrier liner is deposited which typically comprises TaN/Ta with thicknesses ranging from 50 to 500 A. This is followed by seed deposition, preferably by Cu ranging from 0.01 to 1 μm. The wafer is then sent through a Cu electroplating bath to deposit plated Cu that covers the walls but does not fill the annular region completely. Typically, the plating process is stopped when the unfilled annular region is within range of 1 to 5 μm. This is followed by deposition of a second barrier layer, e.g., Ta/TaN with thicknesses ranging from 50 to 500 A.

The next step consists of depositing a polymer, e.g., a polyimide or a photosensitive polyimide, such as fluorinated polyimide, polyorganohydrosilane, polyphenylenes, polysiloxanes, copolymers of divinylsiloxane and bisbenzocyclobutene, polybenzil, polyarylethers and polytetrafluroroethylene. The polyimide is preferably cured according to manufacturer specifications. The polymer is then removed from the uppermost surface, preferably using a plasma ash or similar process. This exposes the Barrier 2/Cu/Barrier 1, which are subsequently removed from the uppermost surface of the wafer by a polish or CMP polish or other similar processes.

The wafer is then back-side thinned to expose the bottom of the TSVs such that they protrude from the back surface. The amount of protrusion should be equal to or be greater than the thickness of the two barrier layers, added to the copper, and added to the via insulating layer. The next step is to depose an insulator or insulators, e.g., nitride/oxide/nitride. It is followed by a polish or chemical-mechanical polish (CMP) step that removes the nitride/oxide/nitride, and the bottom of the TSV, such that the inner and outer conductors are now electrically isolated.

With the coaxial disclosure, the isolation mentioned above applies only to the outer shield. The isolation to the inner conductor is now defined by the film (PSPI) that resides between the inner conductor and the outer conductor. This film can be thicker, i.e., 2 μm or more, and have a better dielectric constant, e.g., 3.3=k, for HD-4004 manufactured by DuPont.

Furthermore, it is advantageous to employ a lower k value material as the insulating layer that separates the conductors, since this helps reducing the capacitance, and, thereby, allows the signals to travel faster through the TSV.

While the present invention has been particularly described in conjunction of a simple illustrative embodiment, it is to be understood that one of ordinary skill in the art that the foregoing and other changes in form and detail may be made therein without departing from the spirit and scope of the invention.

What is claimed is:

1. An integrated circuit (IC) coaxial through-silicon via (TSV) structure comprising:
    a substrate provided with at least one TSV extending vertically down from a top surface of said substrate, said TSV having an inner conductor of tubular shape surrounding a post made of a same material as said substrate, said inner conductor separated from said post by a first dielectric; and
    an outer conductor of tubular shape concentric to said inner conductor separated from said inner conductor by a second dielectric surrounding an outer surface of said inner conductor, said outer conductor insulated from said substrate by said first insulator and provides said inner conductor with an outer shield that provides significant capacitance reduction and protection from electromagnetic interference.

2. The IC coaxial TSV structure as recited in claim 1 further comprises a center post made of the same material as said substrate.

3. The IC coaxial TSV structure as recited in claim 1, wherein said conductive lines are connected to active layers provided with interconnect wires or passive circuitry formed upon said substrate.

4. The IC coaxial TSV structure as recited in claim 1, wherein said conductive lines respectively make electrical contact with interconnect wires, and are respectively connected to a voltage or to ground.

5. The IC coaxial TSV structure as recited in claim 2, wherein said TSV is an annular via having an inner and an outer wall filled with insulating material deposited on exposed surfaces.

6. The IC coaxial TSV structure as recited in claim 5 wherein said insulator outer wall is a dielectric film covering sidewalls of said coaxial TSV outer circumference, and wherein said insulator inner wall is a dielectric film covering said central post of said via.

7. The IC coaxial TSV structure as recited in claim 5, wherein said insulating material electrically insulates said substrate from said conductive lines.

8. The IC coaxial TSV structure as recited in claim 6, wherein said insulating material is a photosensitive polyimide insulator (PSPI).

9. The IC coaxial TSV structure as recited in claim 8, wherein said PSPI comprises at least one of polyimide, benzocyclobutene or fluorinated polyimide, polyorganohydrosilane, polyphenylenes, polysiloxanes, copolymers of divinylsiloxane and bisbenzocyclobutene, polybenzil, polyarylethers and polytetraflurorethylene, and photosensitive polymers.

10. The IC coaxial TSV structure as recited in claim 1, wherein said center post is filled with polyimide.

11. The IC coaxial TSV structure as recited in claim 1, wherein said coaxial TSV topside and backside surfaces are planarized, severing a connection between said conductive lines.

12. The IC coaxial TSV structure as recited in claim 1, further comprising two of said severed conductive lines respectively connected to a voltage and to ground and coupled to said center post.

13. The IC coaxial TSV structure as recited in claim 1, wherein three of said conductive lines respectively connected to voltages and to ground and coupled to two center posts form a triaxial TSV.

* * * * *